United States Patent
Kipnis et al.

(10) Patent No.: US 9,071,269 B2
(45) Date of Patent: Jun. 30, 2015

(54) ENCODING DATA FOR STORAGE IN A DATA STORAGE DEVICE

(71) Applicant: SANDISK TECHNOLOGIES INC., Plano, TX (US)

(72) Inventors: Alon Kipnis, Ma'Ale Gamla (IL); Itai Dror, Omer (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 304 days.

(21) Appl. No.: 13/632,466

(22) Filed: Oct. 1, 2012

(65) Prior Publication Data
US 2014/0095768 A1    Apr. 3, 2014

(51) Int. Cl.
*H03M 7/30*    (2006.01)
*H03M 1/26*    (2006.01)
*H03M 13/00*   (2006.01)
(Continued)

(52) U.S. Cl.
CPC .............. *H03M 7/3077* (2013.01); *H03M 7/55* (2013.01); *H03M 7/3068* (2013.01); *H03M 7/3088* (2013.01); *H03M 7/6017* (2013.01); *H03M 7/6041* (2013.01); *H03M 7/6011* (2013.01); *H03M 1/26* (2013.01); *G06F 12/0253* (2013.01); *G06F 12/0246* (2013.01); *G11C 16/349* (2013.01); *H03M 13/00* (2013.01); *G06F 2212/403* (2013.01); *H03M 13/152* (2013.01); *G06F 2212/401* (2013.01)

(58) Field of Classification Search
CPC ... H03M 7/3068; H03M 7/3088; H03M 7/55; H03M 7/6011; H03M 7/6017; H03M 7/6041; H03M 1/26; H03M 13/00; H03M 13/152; G06F 12/0246; G06F 12/0253; G06F 2212/401; G06F 2212/403; G06F 2212/7207; G11C 16/349

USPC ......... 714/763, 768, 773, 774, 766, 781, 782, 714/784, 799; 365/185.33; 707/813; 711/103, 154; 341/51, 65, 67; 709/247
See application file for complete search history.

(56) References Cited

U.S. PATENT DOCUMENTS 7,098,817 B2    8/2006  Cornelius et al.
7,254,689 B1 *  8/2007  Dorward et al. .............. 711/168
(Continued)

FOREIGN PATENT DOCUMENTS

WO    2007031380 A2    3/2007

OTHER PUBLICATIONS

Abel, Improvements to the Burrows-Wheeler Compression Algorithm: After BWT Stages, Mar. 31, 2003, University Duisburg-Essen, pp. 1-26.*
Wirth et al., Can we do without ranks in Burrows Wheeler Transform compression?, 2001, IEEE, pp. 419-428.*
Jiang et al., Rank Modulation for Flash Memories, Jun. 2009, IEEE, vol. 55, No. 6, pp. 2659-2660.*
Gad et al., Constant-Weight Gray Codes for Local Rank Modulation, 2010, IEEE, pp. 1-12.*

(Continued)

*Primary Examiner* — John J Tabone, Jr.
(74) *Attorney, Agent, or Firm* — Toler Law Group, PC

(57) ABSTRACT

A data storage device includes a memory and a controller. A method performed in the data storage device includes performing a first transformation of a unit of data to generate a first transformed unit of data. Performing the first transformation includes sorting permutations of the unit of data. The method includes performing a move-to-front transformation of the first transformed unit of data to generate a second transformed unit of data. The method includes performing a weight-based encoding of the second transformed unit of data to generate an encoded unit of data. The encoded unit of data has a same number of bits as the unit of data.

21 Claims, 3 Drawing Sheets

(51) Int. Cl.
*G06F 12/02* (2006.01)
*G11C 16/34* (2006.01)
*H03M 13/15* (2006.01)

(56) References Cited

U.S. PATENT DOCUMENTS

| | | | | |
|---|---|---|---|---|
| 7,274,671 | B2* | 9/2007 | Hu | 370/256 |
| 7,673,215 | B2* | 3/2010 | Wybenga et al. | 714/758 |
| 8,176,234 | B2* | 5/2012 | Franceschini et al. | 711/103 |
| 8,190,584 | B1* | 5/2012 | Kemeny | 707/693 |
| 8,341,501 | B2* | 12/2012 | Franceschini et al. | 714/774 |
| 8,499,221 | B2* | 7/2013 | Franceschini et al. | 714/767 |
| 8,537,038 | B1* | 9/2013 | Semenyuk et al. | 341/107 |
| 8,621,328 | B2* | 12/2013 | Franceschini et al. | 714/773 |
| 8,643,515 | B2* | 2/2014 | Cideciyan | 341/65 |
| 2010/0281340 | A1* | 11/2010 | Franceschini et al. | 714/763 |
| 2011/0138104 | A1* | 6/2011 | Franceschini et al. | 711/103 |
| 2013/0013870 | A1* | 1/2013 | Cronie et al. | 711/154 |
| 2013/0019029 | A1* | 1/2013 | Jagmohan et al. | 709/247 |

OTHER PUBLICATIONS

Jagmohan et al., Adaptive Endurance Coding for NAND Flash, 2010, IEEE, pp. 1841-1845.*

Arnavut et al., Lossless compression of color palette images with one-dimensional techniques, Apr.-Jun. 2006, The Journal of Electronic Imaging, vol. 15(2), pp. 023014-1 to 023014-11.*

Chapin, Brenton, Higher Compression From the Burrows-Wheeler Transform With New Algorithms for the List Update Problem, May 2001, University of North Texas, pp. 1-110.*

Chapin et al., Higher Compression from the Burrows-Wheeler Transform by Modified Sorting, 1998, IEEE, pp. 1-11.*

S. Deorowicz, "Second step algorithms in the Burrows-Wheeler compression algorithm", Softw. Pract. Exper; 32-99-111, 2002.*

S. Deorowicz, "Improvements to Burrows-Wheeler compression algorithm", Softw. Pract. Exper: 2000, 30:1465-1483.*

B. Balkenhol et al., Modifications of the Burrows and Wheeler Data Compression Algorithm), Proc. IEEE Data Compression Conference (DCC '99), pp. 188-197, 1999.*

* cited by examiner

ENCODING DATA FOR STORAGE IN A DATA STORAGE DEVICE

FIELD OF THE DISCLOSURE

The present disclosure is generally related to encoding data to be stored in a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases.

An occurrence of errors in data stored in a memory device may be influenced by the specific pattern of data programmed to the memory device. For example, cross-coupling effects between adjacent cells of a flash memory may be reduced when storing data patterns that cause adjacent cells to be programmed to have similar threshold voltages, while cross-coupling effects may be more pronounced for data patterns that cause adjacent cells to have widely differing threshold voltages. Other aspects of data storage, such as programming latency, power consumption during storage, and an amount of wear experienced by the memory device, may also be influenced by characteristics of data stored to the memory device.

SUMMARY

Data is transformed prior to storage in a non-volatile memory according to a series of transformations. A first transformation includes sorting permutations of a unit of the data, such as according to a Burrows-Wheeler transformation. After the first transformation, a move-to-front transformation is performed. An output of the move-to-front transformation is encoded using a weight-based encoding. Each of the first transformation, the move-to-front transformation, and the weight-based encoding may conserve a number of bits of the unit of data during the respective transformations so that no data compression or data expansion is performed.

By applying the first transformation before the move-to-front transformation, an entropy of the output of the move-to-front transformation is reduced (e.g., an average weight of a unit of data input to the move-to-front transformation is greater than an average weight of a unit of data output from the move-to-front transformation). As a result, an efficiency of the weight-based encoding may be enhanced as compared to a system that omits the first transformation. Weights used in the weight-based encoding may be selected to improve an endurance of the non-volatile memory, to reduce a programming time to store encoded data to the non-volatile memory, to reduce an amount of power consumed during programming to the non-volatile memory, or a combination thereof.

DETAILED DESCRIPTION

Figure 1:
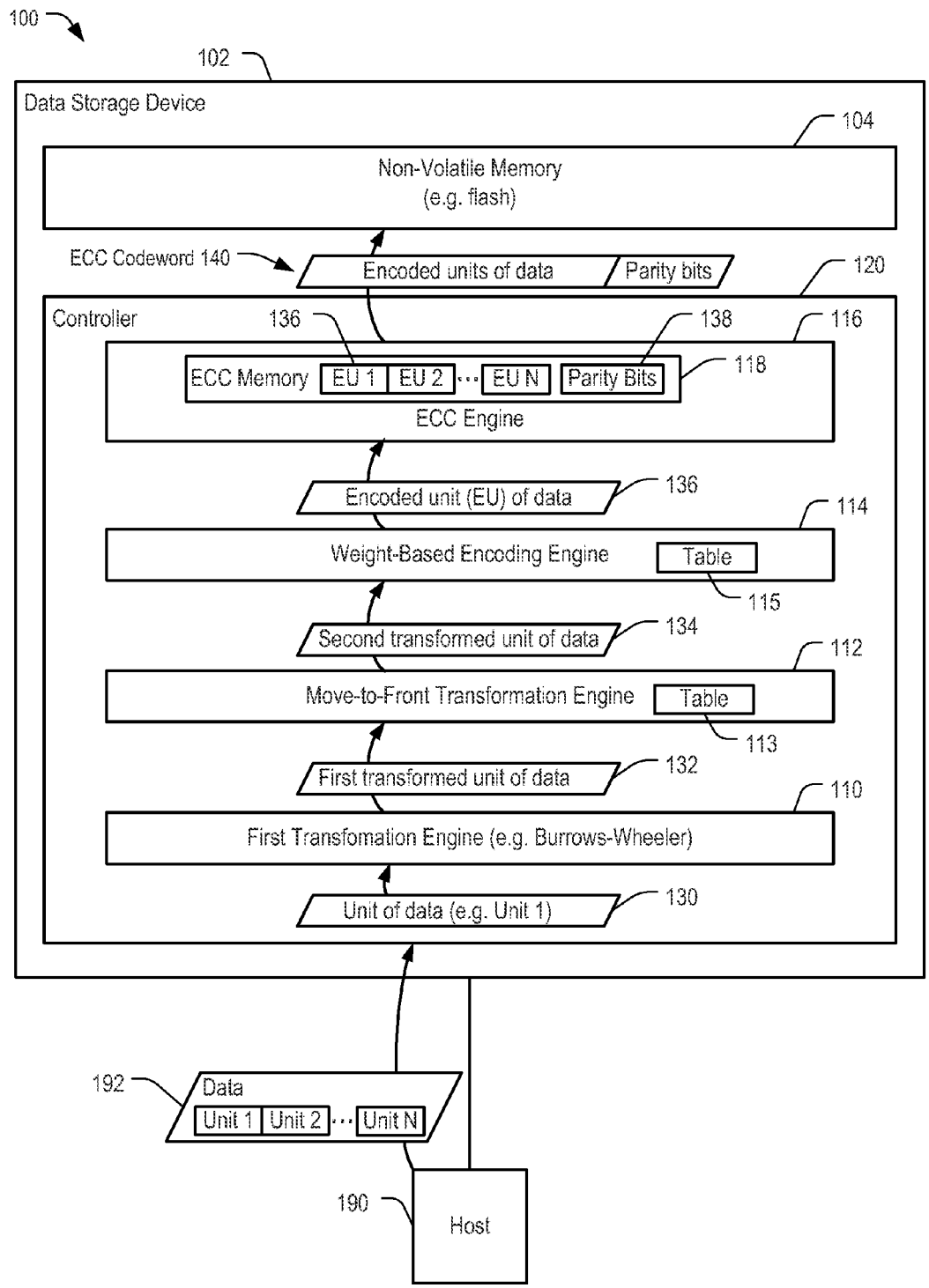
FIG. 1 is a block diagram of a particular illustrative embodiment of a system including a data storage device configured to apply a series of transformations to data prior to storing the data.

Referring to FIG. 1, a particular embodiment of a system 100 includes a host device 190 operatively coupled to a data storage device 102. The data storage device 102 is configured to perform multiple transformations of data received from the host device 190 prior to storage in a non-volatile memory 104. The multiple transformations include a first transformation at a first transformation engine 110, a move-to-front transformation at a move-to-front transformation engine 112, a weight-based encoding at a weight-based encoding engine 114, and an error correction coding (ECC) operation that may be performed at an ECC engine 116. The first transformation performed at the first transformation engine 110 may include sorting permutations of a unit of data, such as according to a Burrows-Wheeler transformation. By performing the first transformation prior to performing the move-to-front transformation, an entropy of the output of the move-to-front transformation may be reduced.

The host device 190 may be configured to provide data, such as data 192, to be stored at the non-volatile memory 104 or to request data to be read from the non-volatile memory 104. For example, the host device 190 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 102 includes the non-volatile memory 104 coupled to a controller 120. For example, the non-volatile memory 104 may be a NAND flash memory. The non-volatile memory 104 may include multiple groups of storage elements, such as word lines of a multi-level cell (MLC) flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 190 as embedded memory, such as eMMC® (trademark of JEDEC Solid State Technology Association, Arlington, Va.) and eSD, as illustrative examples.

The controller 120 is configured to receive data and instructions from and to send data to the host device 190 while the data storage device 102 is operatively coupled to the host device 190. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

Figure 2:
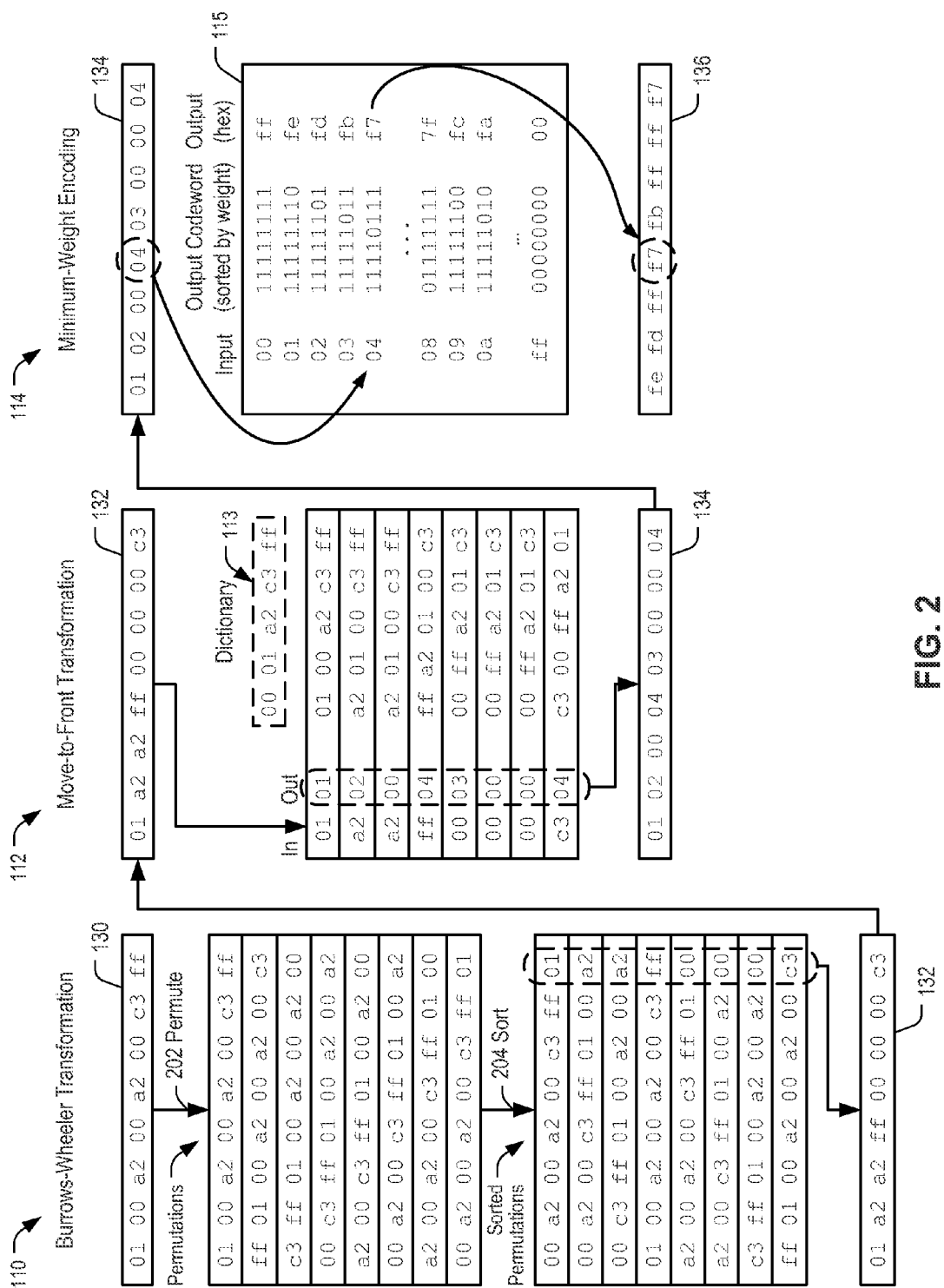
FIG. 2 is a general diagram illustrating an example of transformations that may be applied by the data storage device of FIG. 1.

The first transformation engine 110 is configured to receive a unit of data 130, such as a first unit (Unit 1) of the data 192. For example, the unit of data 130 may correspond to one byte, multiple bytes (e.g., 8 bytes), or any other number of bits of the data 192. The first transformation engine 110 is configured to perform the first transformation to the unit of data 130 to generate a first transformed unit of data 132. The first transformation includes sorting permutations of the unit of data 130. For example, the first transformation engine 110 may generate all permutations of groups of bits received in the unit of data 130 and may sort the permutations lexicographically. For example, permutations with a first group of bits having a '0' value (e.g., binary '00000000' may be sorted to have an earlier position than permutations with a first group of bits having a '1' value (e.g., binary '00000001'). When two or more permutations have matching first groups of bits, a sort order may be determined by comparing values of a second group of bits of the two or more permutations, continuing to successive groups of bits as appropriate until a sort order is established. A last group of bits of each of the sorted permutations may be selected as the first transformed unit of data 132. An example of the first transformation is illustrated in FIG. 2, in an embodiment where the first transformation corresponds to a Burrows-Wheeler transformation.

The move-to-front transformation engine 112 is configured to receive the first transformed unit of data 132 and to perform a move-to-front transformation to generate a second transformed unit of data 134. For example, the move-to-front transformation engine 112 may maintain a table 113 of entries (e.g., a "dictionary") corresponding to possible values of groups of bits. As each group of bits (e.g., each byte) of the first transformed unit of data 132 is processed, a corresponding entry in the table 113 may be moved to a first position of the table 113 and an output value may be generated that indicates a number of positions the entry is moved within the table 113. An example of operation of a move-to-front transformation is illustrated in further detail with respect to FIG. 2.

The weight-based encoding engine 114 is configured to receive the second transformed unit of data 134 and to perform an encoding to generate an output codeword based on a weight of each output codeword. For example, the weight-based encoding engine 114 may include a table 115 to provide a mapping of input values to output codewords. The output codewords may be sorted according to a weight of each of the output codewords. As a result, bit patterns that have a higher likelihood to be present in the second transformed unit of data 134 may be mapped to codewords having lower weights, while bit patterns having a lower likelihood of being included in the second transformed unit of data 134 may be mapped to output codewords having higher weights (e.g., a "minimum-weight"-type encoding).

As an example, the weight-based encoding may correspond to an endurance coding of data to be stored to the non-volatile memory 104. For example, the non-volatile memory 104 may have a greater endurance when one-values are stored as compared to when zero-values are stored, such as in a NAND flash memory. As a result, a weight of each codeword may be at least partially based on a count of zero-values in the codeword. An example of weight-based encoding using an endurance coding weighting is illustrated with respect to FIG. 2.

As another example, a weight of each codeword may be at least partially based on an amount of programming time to program the codeword to the non-volatile memory 104. For example, in an implementation where the non-volatile memory 104 includes flash memory cells, codewords that correspond to one or more of the flash memory cells being programmed to have a relatively high threshold voltage may have a longer programming time than codewords that correspond to flash memory cells having relative low threshold voltages. As another example, a weight of each codeword may be at least partially based on a likelihood of an error occurring in the codeword while the codeword is stored in the non-volatile memory 104. As a further example, a weight of each codeword may be at least partially based on an amount of power that is used to program the codeword to the non-volatile memory 104.

The encoded unit of data 136 may be provided to an ECC engine 116 that is configured to receive data to be stored to the non-volatile memory 104 and to generate a codeword. For example, the ECC engine 116 may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 116 may include a decoder configured to decode data read from the non-volatile memory 104 to detect and correct, up to an error correction capability of the ECC scheme, any bit errors that may be present in the data.

The ECC engine 116 may include an ECC memory 118 configured to store one or more encoded units of data, such as the first encoded unit of data 136, and to generate parity bits 138 corresponding to the stored encoded units of data. The encoded units of data and the parity bits 138 may be provided to the non-volatile memory 104 to be stored as an ECC codeword 140.

The encoded unit of data 136 that is output by the weight-based encoding engine 114 has a same number of bits as the unit of data 130 that is input to the first transformation engine 110. To illustrate, each of the transformation engines 110-114 may generate an output having the same number of bits as a corresponding input (i.e., a fixed-to-fixed transformation, as opposed to fixed-to-variable, variable-to-fixed, or variable-to-variable transformations). Thus, the transformations 110-114 may be performed without a compression and/or expansion of data.

During operation, the host device 190 may send the data 192 to the data storage device 102 for storage at the non-volatile memory 104. The data 192 may include multiple units, illustrated as a first unit (Unit 1), a second unit (Unit 2), to an Nth unit (Unit N). Each of the units of the data 192 may be provided sequentially to the first transformation engine 110. For example, in FIG. 1, the unit of data 130 provided to the first transformation engine 110 corresponds to the first unit of data of the data 192. The first transformation engine 110 may receive the unit of data 130 and may sort permutations of the unit of data 130 to generate the first transformed unit of data 132. The first transformed unit of data 132 may be provided to the move-to-front transformation engine 112. The move-to-front transformation engine 112 may perform a move-to-front transformation of the first transformed unit of data 132 to generate the second transformed unit of data 134. The second transformed unit of data 134 may be received at the weight-based encoding engine 114 and may be encoded according to a weight-based encoding to generate the encoded unit of data 136.

The encoded unit of data 136 may be provided to the ECC engine 116 and stored in the ECC memory 118. As successive units of data of the data 192 are processed by the transformation engines 110-114, corresponding encoded units of data are received at the ECC engine 116 and stored in the ECC memory 118 until an entirety of the data 192 has been processed and corresponding encoded data stored in the ECC memory 118. Upon receiving a sufficient number of encoded units of data corresponding to the data 192, the ECC engine 116 may initiate an ECC encode operation to generate the parity bits 138. The encoded units of data and the parity bits 138 may be sent to the non-volatile memory 104 for storage as the ECC codeword 140.

During a data read operation, a representation of the ECC codeword 140 may be retrieved from the non-volatile memory 104 and provided to the ECC memory 118 at the ECC engine 116. The representation of the ECC codeword 140 received from the non-volatile memory 104 may include one or more bit errors. The ECC engine 116 may perform an ECC decode operation to locate and correct bit errors occurring in the representation of the ECC codeword 140, up to an error correction capability of the ECC codeword 140.

After decoding the representation of the ECC codeword 140, encoded units of data may be provided to the weight-based encoding engine 114 for a decoding operation. For example, the encoded unit of data 136 may be provided from the ECC memory 118 to the weight-based encoding engine 114. The weight-based encoding engine 114 may perform a reverse mapping using the table 115 to generate the second transformed unit of data 134. The second transformed unit of data 134 may be provided to the move-to-front transformation engine 112. The move-to-front transformation engine 112 may perform a reverse move-to-front transformation using the table 113 to generate the first transformed unit of data 132. The first transformed unit of data 132 may be provided to the first transformation engine 110. The first transformation engine 110 may perform a reverse transformation to generate the unit of data 130. Sequential units of data output from the first transformation engine 110 may be combined to generate the data 192 that may be provided to the host device 190.

By applying the first transformation before the move-to-front transformation, an entropy of the output of the move-to-front transformation is reduced as compared to systems that do not apply the first transformation before a move-to-front transformation, as explained in further detail with respect to FIG. 2. As a result, an efficiency of the weight-based encoding may be enhanced as compared to a system that omits the first transformation.

FIG. 2 illustrates a particular embodiment showing details of an implementation of transformations and encodings that may be performed at the controller 120 of FIG. 1.

The unit of data 130 is illustrated as including eight bytes of data, depicted in a hexadecimal format (i.e., a two-character format, each character having a value from '0' to where '0' represents binary '0000' and 'f' represents binary '1111'). As illustrated in FIG. 2, the first transformation engine 110 may perform a Burrows-Wheeler transformation that includes a permute operation 202 to generate permutations of bytes of the unit of data 130. As illustrated, because the unit of data 130 is segmented into eight bytes, eight permutations of the eight bytes are illustrated. After generating the permutations, a sort operation 204 is performed where the permutations are sorted lexicographically, as described with respect to FIG. 1. For example, a first sorted permutation may have a lowest lexicographic value (e.g., 00 22 00 22 . . . ) and a second sorted permutation may have a next-lowest lexicographic value (e.g., 00 22 00 c3 . . . ). After sorting the permutations, a last byte of each permutation may be used to generate the first transformed unit of data 132.

The first transformed unit of data 132 is provided to the move-to-front transformation engine 112 that performs a move-to-front transformation. The move-to-front transformation is illustrated as including the table 113 in form of a dictionary of byte values. For simplicity of explanation, the dictionary 113 is illustrated as having five byte values, corresponding to the five distinct byte values in the first transformed unit of data 132. However, it should be understood that the dictionary 113 may include an entry for each possible byte value (i.e., 256 entries corresponding to all possible bit combinations in an 8-bit byte).

The dictionary 113 has an initial arrangement where the entries are sorted according to binary value, such that a first entry in the first location of the dictionary 113 corresponds to '00' (i.e., in hexadecimal notation), a second entry in the second location of the dictionary 113 corresponds to '01', and a last entry in a last location of the dictionary 113 corresponds to 'ff'. (As used in the example of FIG. 2, the "first location" of the dictionary corresponds to the location that contains the entry having the lowest binary value in the initial arrangement of the dictionary 113.) Bytes from the first transformed unit of data 132 are received and processed sequentially. An entry corresponding to the first byte '01' of the first transformed unit of data 132 is located in the dictionary 113 at a second location. The entries in the dictionary 113 are rearranged, with the entry corresponding to '01' moved to the first location, and all other entries appearing prior to the '01' entry in the dictionary 113 are pushed back one location. An output value is generated corresponding to a number of locations that the entry is moved when placed in the first location (i.e., the output value is based on a location of the entry in the dictionary 113). As illustrated in FIG. 2, for the first input byte '01' of the first transformed unit of data 132, the entry corresponding to '01' in the dictionary 113 is moved a single location, resulting in an output value of '01'. The output values of the move-to-front transformation are used to generate the second transformed unit of data 134.

The second transformed unit of data 134 is provided to the weight-based encoding engine 114 to perform a weight-based encoding. The weight-based encoding is illustrated as including the table 115 as a minimum-weight encoding showing output codewords that are sorted according to a weight of each codeword. As illustrated, the table 115 corresponds to an implementation of weighting according to endurance coding, where a weight of each codeword is at least partially based on a number of 0-values appearing in each codeword. As illustrated, the table 115 is sorted according to the weight of each codeword, beginning with a codeword having a lowest weight corresponding to an all is value (i.e., 'ff'), followed by entries of codewords having a single 0-value, next followed by codewords having two 0-values, and continuing to a final codeword having the highest weight and corresponding to an all-0s value (i.e., '00').

The weight-based encoding operation includes, for each byte in the second transformed unit of data 134, accessing the table 115 using the byte value as an index, and mapping the input index value to an output value. For example, the first byte '01' of the second transformed unit of data 134 is mapped to an output value of 'fe', the second byte '02' is mapped to 'fd', the third byte '00' is mapped to 'ff', the fourth byte '04' is mapped to 'f7', etc. The output values of the weight-based encoding operation are used to generate the encoded unit of data 136.

As illustrated, the weight-based encoding does not always generate an output having a 'true' minimum weight (e.g., all 'ff' values for endurance encoding) but instead assigns a lowest weight output value to the input value that is expected to have a highest probability or rate of occurrence, a next lowest weight output value to the input value that is expected to have a next-highest probability or rate of occurrence, etc. As a result, an effectiveness of the weight-based encoding is improved when the data to be encoded has a high percentage of input values that are mapped to the lowest weight output values and a low percentage of input values that are mapped to the other (higher weight) output values, i.e., the input to the weight-based encoding has a low entropy.

The move-to-front transformation may provide an overall reduction of data entropy, improving an effectiveness of the weight-based encoding, by using first-order statistics (e.g., based on a number of repeated sequential groups of bits in the data). For example, an input value of 'ff ff ff ff 00 00 00 00' received at the move-to-front transformation may be transformed to the value 'ff 00 00 00 01 00 00 00'. If the input value of 'ff ff ff ff 00 00 00 00' were received at the embodiment of the weight-based encoding engine 114 that is illustrated in FIG. 2, the weight-based encoding engine 114 would produce the output '00 00 00 00 ff ff ff ff' that has 32 zero-values and 32 one-values. However, by applying the move-to-front transformation to the input data prior to weight-based encoding, the weight-based encoding engine 114 instead receives the input 'ff 00 00 00 01 00 00 00', resulting in the output '00 ff ff ff fe ff ff ff' that has 9 zero-values and 55 one-values. As a result, an effectiveness of the weight-based encoding is significantly improved.

However, further improvement may be achieved by using the first transformation that incorporates higher-order statistics (e.g., repeated sequences of groups of bits in the data). For example, an input value of '00 ff 00 ff 00 ff 00 ff' received at the first transformation engine 110 may be transformed to the value 'ff ff ff ff 00 00 00 00'. If the input value of '00 ff 00 ff 00 ff 00 ff' were received at the input of the move-to-front transformation engine 112, an output of '00 ff 01 01 01 01 01 01' would be generated and encoded at the weight-based encoding engine 114 as an output if '00 fe fe fe fe fe fe' that has 14 zero-values and 50 one-values. However, by applying the first transformation prior to move-to-front encoding, the input value of '00 ff 00 ff 00 ff 00 ff' is transformed to the value 'ff ff ff ff 00 00 00 00' that is provided to the move-to-front transformation engine 112, resulting in an output value 'ff 00 00 00 01 00 00 00' that is encoded at the weight-based encoding engine 114 to generate the output '00 ff ff ff fe ff ff ff' that has 9 zero-values and 55 one-values. As a result, a total weight of the output of the weight-based encoding is reduced as a result of applying the first transformation.

Although FIG. 2 illustrates the unit of data 130, the first transformed unit of data 132, the second transformed unit of data 134, and the encoded unit of data 136 as having a size of 8 bytes, in other implementations the unit of data 130, the first transformed unit of data 132, the second transformed unit of data 134, and the encoded unit of data 136 may have a different size. Although each of the first transformation, the move-to-front transformation, and the weight-based encoding are illustrated as operating on groups of bits having a size of 1 byte, in other implementations one or more of the transformations may operate on groups of bits having a different size. For example, larger groups of bits may provide improved results (e.g., faster generation and sorting of the permutations at the first transformation engine 110 and/or lower weight codewords generated by the weight-based encoding engine 114) but may increase a size and an amount of memory to store the dictionary 113 and/or the table 115.

Figure 3:
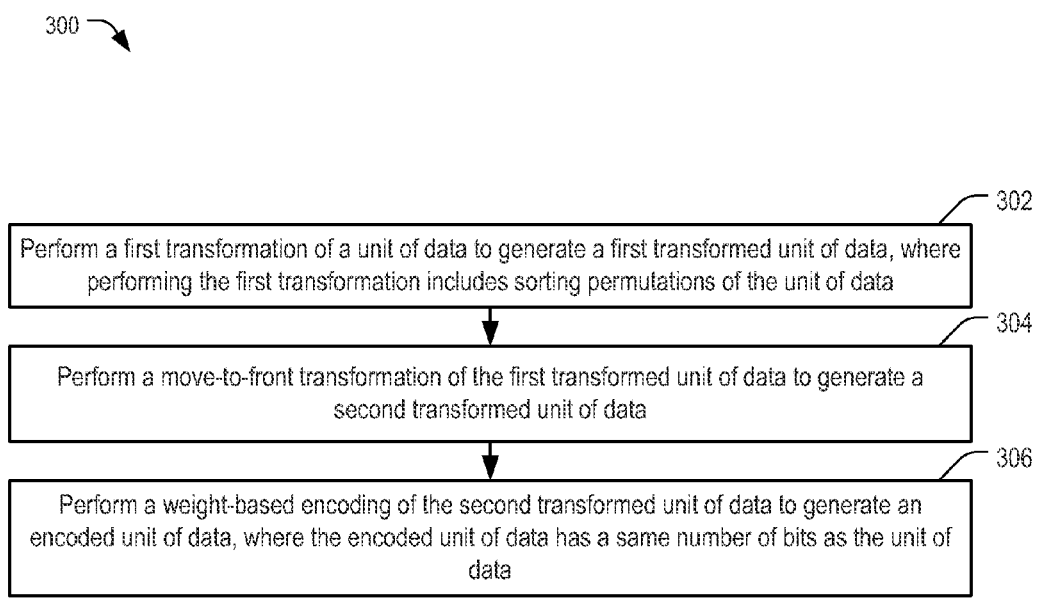
FIG. 3 is a flow chart of a particular illustrative embodiment of a method of that may be performed by the data storage device of FIG. 1.

Referring to FIG. 3, a method 300 that may be performed in a data storage device, such as the data storage device 102 of FIG. 1, is depicted. The method 300 includes performing a first transformation of a unit of data to generate a first transformed unit of data, at 302. The first transformation may be performed at the first transformation engine 110 of FIG. 1. Performing the first transformation includes sorting permutations of the unit of data. For example, the first transformation may include a Burrows-Wheeler transformation, such as including the permute operation 202 and the sort operation 204 illustrated in FIG. 2.

A move-to-front transformation of the first transformed unit of data is performed to generate a second transformed unit of data, at 304. The move-to-front transformation may be performed at the move-to-front transformation engine 112 of FIG. 1. The move-to-front transformation may include generating the second transformed unit of data based on a location of an entry corresponding to the first transformed unit of data in a table and updating the table to position the entry at a first location in the table. For example, the table may correspond to the dictionary 113 illustrated with respect to FIG. 2.

A weight-based encoding of the second transformed unit of data is performed to generate an encoded unit of data, at 306. The encoded unit of data has a same number of bits as the unit of data. The weight-based encoding may be performed at the weight-based encoding engine 114 of FIG. 1. For example, the weight-based encoding may include a minimum-weight-type encoding and may correspond to an endurance encoding using the table 115 as illustrated in FIG. 2.

The encoded unit of data may be stored in a memory of the data storage device, such as in the non-volatile memory 104 of FIG. 1. For example, an error correction coding (ECC) operation may be applied to the encoded unit of data to generate parity bits, such as the parity bits 138 generated by the ECC engine 116 of FIG. 1. Storing the encoded unit of data may include storing the parity bits in the memory, such as by storing the ECC codeword 140 of FIG. 1.

The weight-based encoding may include accessing a table of codewords that is sorted according to a weight of each of the codewords and mapping the second transformed unit of data to the encoded unit of data according to the table of codewords, such as illustrated with respect to the table 115 of FIG. 2. The weight-based encoding may correspond to an endurance coding of data to be stored to a memory of the data storage device. To illustrate, a weight of each codeword may be at least partially based on a count of one-values in the codeword. Alternatively, or in addition, a weight of each codeword may be at least partially based on an amount of programming time to program the codeword to a memory of the data storage device. Alternatively, or in addition, a weight of each codeword may be at least partially based on a likelihood of an error occurring in the codeword while the codeword is stored in a memory of the data storage device. Alternatively, or in addition, a weight of each codeword may be at least partially based on an amount of power used to program the codeword to a memory of the data storage device.

Although various components depicted herein are illustrated as block components and described in general terms, such components may include one or more microprocessors, state machines, or other circuits configured to enable the transformation engines 110-114 of FIG. 1 to perform a series of transformations of input data prior to storage at the non-volatile memory 104. For example, the first transformation engine 110 may represent physical components, such as hardware controllers, state machines, logic circuits, or other structures, to enable the first transformation engine 110 to receive the unit of data 130, generate permutations of the unit of data, sort the permutations, and generate the first transformed unit of data 132 using one or more bits from each sorted permutation.

One or more of the transformation engines 110-114 of FIG. 1 may be implemented using a microprocessor or microcontroller programmed to perform the transformation indicated as performed by the particular engine. For example, the first transformation engine 110 may include a processor programmed to receive the unit of data 130, to generate permutations of the unit of data, to sort the permutations, and to generate the first transformed unit of data 132 using one or more bits from each sorted permutation. In a particular embodiment, one or more of the transformation engines 110-114 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    in a data storage device, performing:
        performing a first transformation of a unit of data to generate a first transformed unit of data, wherein performing the first transformation includes sorting permutations of the unit of data;
        performing a move-to-front transformation of the first transformed unit of data to generate a second transformed unit of data; and
        performing a weight-based encoding of the second transformed unit of data to generate an encoded unit of data, wherein the encoded unit of data has a same number of bits as the unit of data and as the second transformed unit of data.

2. The method of claim 1, wherein the first transformation includes a Burrows-Wheeler transformation, and wherein the encoded unit of data has the same number of bits as the first transformed unit of data.

3. The method of claim 1, further comprising storing the encoded unit of data in a memory of the data storage device.

4. The method of claim 3, further comprising applying an error correction coding (ECC) operation to the encoded unit of data to generate parity bits, and wherein storing the encoded unit of data includes storing the parity bits in the memory.

5. The method of claim 1, wherein the move-to-front transformation includes generating the second transformed unit of data based on a location of an entry corresponding to the first transformed unit of data in a table and updating the table to position the entry at a first location in the table.

6. The method of claim 1, wherein the weight-based encoding includes accessing a table of codewords that is sorted according to a weight of each of the codewords and mapping the second transformed unit of data to the encoded unit of data according to the table of codewords.

7. The method of claim 6, wherein the weight-based encoding corresponds to an endurance coding of data to be stored to a memory of the data storage device.

8. The method of claim 7, wherein the weight of each codeword is at least partially based on a count of one-values in the codeword.

9. The method of claim 6, wherein the weight of each codeword is at least partially based on an amount of programming time to program the codeword to a memory of the data storage device.

10. The method of claim 6, wherein the weight of each codeword is at least partially based on a likelihood of an error occurring in the codeword while the codeword is stored in a memory of the data storage device.

11. The method of claim 6, wherein the weight of each codeword is at least partially based on an amount of power used to program the codeword to a memory of the data storage device.

12. A data storage device comprising:
    a memory; and
    a controller coupled to the memory, wherein the controller is configured to perform a first transformation of a unit of data to generate a first transformed unit of data, wherein the first transformation includes sorting permutations of the unit of data, to perform a move-to-front transformation of the first transformed unit of data to generate a second transformed unit of data, and to perform a weight-based encoding of the second transformed unit of data to generate an encoded unit of data to be stored in the memory, wherein the encoded unit of data has a same number of bits as the unit of data and as the second transformed unit of data.

13. The data storage device of claim 12, wherein the first transformation includes a Burrows-Wheeler transformation.

14. The data storage device of claim 12, wherein the controller is further configured to apply an error correction coding (ECC) operation to the encoded unit of data to generate parity bits to be stored in the memory.

15. The data storage device of claim 12, wherein the move-to-front transformation includes generating the second transformed unit of data based on a location of an entry corresponding to the first transformed unit of data in a table and updating the table to position the entry at a first location in the table.

16. The data storage device of claim 12, wherein the weight-based encoding includes accessing a table of codewords that is sorted according to a weight of each of the codewords and mapping the second transformed unit of data to the encoded unit of data according to the table of codewords.

17. The data storage device of claim 16, wherein the weight-based encoding corresponds to an endurance coding of data to be stored to the memory.

18. The data storage device of claim 17, wherein the weight of each codeword is at least partially based on a count of one-values in the codeword.

19. The data storage device of claim 16, wherein the weight of each codeword is at least partially based on an amount of programming time to program the codeword to the memory.

20. The data storage device of claim 16, wherein the weight of each codeword is at least partially based on a likelihood of an error occurring in the codeword while the codeword is stored in the memory.

21. The data storage device of claim 16, wherein the weight of each codeword is at least partially based on an amount of power used to program the codeword to the memory.

* * * * *